United States Patent
Dubey et al.

(10) Patent No.: US 10,545,336 B2
(45) Date of Patent: Jan. 28, 2020

(54) TRANSPARENT DISPLAY WITH A CONTROLLABLE MASKING DISPLAY

(71) Applicant: CONTINENTAL AUTOMOTIVE GmbH, Hannover (DE)

(72) Inventors: Arvind Dubey, Punggol (SG); Ki Hyun Lyu, Punggol (SG)

(73) Assignee: Continental Automotive GmbH, Hannover (DE)

(*) Notice: Subject to any disclaimer, the term of this patent is extended or adjusted under 35 U.S.C. 154(b) by 0 days.

(21) Appl. No.: 15/738,843

(22) PCT Filed: Jun. 22, 2015

(86) PCT No.: PCT/IB2015/054661
§ 371 (c)(1),
(2) Date: Dec. 21, 2017

(87) PCT Pub. No.: WO2016/207690
PCT Pub. Date: Dec. 29, 2016

(65) Prior Publication Data
US 2018/0188531 A1    Jul. 5, 2018

(51) Int. Cl.
*G02B 27/01* (2006.01)
*B60K 35/00* (2006.01)
(Continued)

(52) U.S. Cl.
CPC .......... *G02B 27/0101* (2013.01); *B60J 3/04* (2013.01); *B60K 35/00* (2013.01); *G02F 1/1368* (2013.01);
(Continued)

(58) Field of Classification Search
CPC ......... G02B 27/0101; G02B 2027/0138; B60J 3/04; B60K 35/00; B60K 2350/2013;
(Continued)

(56) References Cited

U.S. PATENT DOCUMENTS 9,415,745 B1 * 8/2016 Clemen, Jr. ............. B60R 22/00
2005/0084659 A1   4/2005 Dunkel
(Continued)

FOREIGN PATENT DOCUMENTS

DE   102010006293   8/2011
DE   102014005976   9/2014
(Continued)

OTHER PUBLICATIONS

Office Action dated Jun. 17, 2019 issued in Japanese Patent Application No. 2017-565759.
(Continued)

*Primary Examiner* — James J Yang
*Assistant Examiner* — Kevin Lau
(74) *Attorney, Agent, or Firm* — Cozen O'Connor

(57) ABSTRACT

A transparent display for a vehicle that includes a self-emissive display with an electronically adjustable brightness and a masking display with an electronically adjustable absorption. The masking display is arranged back-to-back with the self-emissive display. At least one light sensor that is arranged in proximity to the masking display. A display controller is connected to the self-emissive display, to the masking display and to the at least one light sensor. The display controller is operative to adapt an absorption of the masking display in response to a signal of the at least one light sensor.

16 Claims, 1 Drawing Sheet

(51) Int. Cl.
*B60J 3/04* (2006.01)
*G02F 1/133* (2006.01)
*G02F 1/1368* (2006.01)
*H01L 27/32* (2006.01)

(52) U.S. Cl.
CPC ...... *G02F 1/13318* (2013.01); *H01L 27/3227* (2013.01); *H01L 27/3232* (2013.01); *H01L 27/3267* (2013.01); *B60K 2370/21* (2019.05); *B60K 2370/349* (2019.05); *B60K 2370/52* (2019.05); *B60K 2370/77* (2019.05); *G02B 2027/0138* (2013.01); *G02F 2201/44* (2013.01)

(58) Field of Classification Search
CPC ...... B60K 2350/2069; B60K 2350/352; B60K 2350/921; G02F 1/13318; G02F 1/1368; G02F 2201/44; H01L 27/3227; H01L 27/3232; H01L 27/3267
See application file for complete search history.

(56) References Cited

U.S. PATENT DOCUMENTS

| | | | |
|---|---|---|---|
| 2010/0328749 A1* | 12/2010 | Hitschmann | B60K 35/00 359/238 |
| 2013/0153940 A1 | 6/2013 | Suganuma et al. | |
| 2014/0019005 A1* | 1/2014 | Lee | G08G 1/166 701/36 |
| 2014/0132530 A1* | 5/2014 | Suh | G06F 3/0412 345/173 |
| 2014/0160154 A1 | 6/2014 | Dominici et al. | |
| 2014/0185129 A1 | 7/2014 | Kim et al. | |
| 2014/0277939 A1* | 9/2014 | Ren | G01C 21/3638 701/36 |
| 2015/0092083 A1 | 4/2015 | Lam | |
| 2016/0147091 A1* | 5/2016 | Christmann | H01L 27/1446 345/207 |

FOREIGN PATENT DOCUMENTS

| | | |
|---|---|---|
| JP | 2004-325600 | 11/2004 |
| JP | 2005-067367 | 3/2005 |
| JP | 2005-070074 | 3/2005 |
| JP | 2011-059215 | 3/2011 |
| JP | 2013-117719 | 6/2013 |
| JP | 2014-209214 | 11/2014 |
| KR | 10 2009010092 | 9/2009 |
| KR | 20090100920 | 9/2009 |
| KR | 10 2014000153 | 1/2014 |
| KR | 20140001538 | 1/2014 |
| WO | WO 2015/008880 | 1/2015 |
| WO | WO 2015008880 | 1/2015 |
| WO | WO 2015/045752 | 4/2015 |

OTHER PUBLICATIONS

Search Report dated Jan. 25, 2019 issued in European Patent Application No. 15896242.3.

* cited by examiner

TRANSPARENT DISPLAY WITH A CONTROLLABLE MASKING DISPLAY

CROSS REFERENCE TO RELATED APPLICATIONS

This is a U.S. national stage of application No. PCT/IB2015/054661, filed on Jun. 22, 2015.

BACKGROUND OF THE INVENTION

1. Field of the Invention

The current disclosure relates to a transparent display with a self-emissive display and a controllable masking display, wherein the displays are arranged back-to-back.

2. Description of the Prior Art

An organic light-emitting diode (OLED) is a light-emitting diode (LED) in which the emissive electroluminescent layer is a film of organic compound that emits light in response to an electric current. This layer of organic semiconductor is situated between two electrodes. There are two main families of OLED: those based on small molecules and those employing polymers. Adding mobile ions to an OLED creates a light-emitting electrochemical cell (LEC) that has a slightly different mode of operation. OLED displays can use either passive-matrix (PMOLED) or active-matrix addressing schemes. Active-matrix OLEDs (AMOLED) require a thin-film transistor backplane to switch each individual pixel on or off, but allow for higher resolution and larger display sizes.

An OLED display works without a backlight. Thus, it can display deep black levels and can be thinner and lighter than a liquid crystal display (LCD). In low ambient light conditions, an OLED screen can achieve a higher contrast ratio than an LCD, regardless of whether the LCD uses cold cathode fluorescent lamps or an LED backlight.

A thin-film-transistor liquid-crystal display (TFT LCD) is a variant of a liquid-crystal display (LCD) that uses thin-film transistor (TFT) technology to improve image qualities such as addressability and contrast. A TFT LCD is an active-matrix LCD, in contrast to passive-matrix LCDs or simple, direct-driven LCDs with a few segments.

US 20050084659 A1 discloses a transparent OLED head-up display (HUD) for a car windscreen. Different from the subject matter of the present specification, this head-up display does not have an electronically controllable masking display. The DE102010006293 discloses a glare shield device for a vehicle windscreen, which is subdivided into multiple partitions, wherein a transmission factor of the partitions can be automatically adjusted as function of intensity. Different from the subject matter of the present application, the glare shield device does not comprise a self-emissive display.

SUMMARY OF THE INVENTION

The present specification discloses a transparent display for a car window, such as a windscreen. The transparent display comprises a self-emissive display with display pixels, wherein the brightness of the individual display pixels can be electronically adjusted by sending a corresponding control signal via a first data cable that is connected to the self-emissive display.

The masking display is arranged back-to-back with the self-emissive display, such that an active surface of the masking display, which has an electronically controllable absorption, covers an active surface or display surface of the self-emitting display, and which has an electronically controllable brightness. In other words, the masking display is arranged on a rear side of the self-emissive display. In the abovementioned arrangement, one or more transparent layers may be provided between the self-emissive display and the masking display.

In particular, an electronically controllable absorption can refer to the switching between a transparent state and an opaque state. In other embodiments the absorption can be dimmed or assume states in between the opaque and the transparent state. The electronically controllable absorption refers to the electronic adjustment of an absorption of predefined areas, such as pixels.

Furthermore, the transparent display comprises at least one light sensor arranged in proximity to the masking display. In particular, the light sensor is designed such that it is able to measure not only the brightness but also the direction of incident light. In one embodiment, only one light sensor is provided. According to one embodiment, multiple light sensors are provided. For example, one light sensor may be provided at each corner of the display for providing a better detection of a direction of incident light.

The light sensors are arranged such that they receive light falling onto an outer surface of the masking display, which is arranged opposite to an inner surface or rear side of the masking display that faces towards the self-emissive display.

Furthermore, the transparent display comprises a display controller connected to the self-emissive display, to the masking display, and to the light sensor or, respectively, to the light sensors. The display controller is operative to adapt an absorption of display pixels of the masking display and/or an intensity of display pixels of the self-emissive display in response to a signal of the light sensor by sending respective control signals to the masking display and/or to the self-emissive display.

The adjustment of the pixel absorption may furthermore depend on the control signal to the self-emissive display. For example if the self-emissive display is brightly illuminated, the controller may reduce the absorption of the masking display.

In particular, the self-emissive display can be realized with an OLED display, which can be produced as a flexible sheet that conforms to the curvature of a windscreen. Furthermore, the masking display can be realized as an LCD display, which allows to control the absorption of predetermined areas on the windscreen. In particular, the LCD display can be provided by a thin-film-transistor (TFT) LCD display.

The LCD display does not require a separate light source as the light source is provided by the self-emissive display. The masking display is used to selectively control a light absorption.

The self-emissive display and the masking display are both connected to the same controller, such that the controller is able to control the absorption of the masking display in dependence of the control signals that are sent to the self-emissive display.

According to one embodiment, the controller is operative to increase absorption in regions of the masking display, which correspond to, or are adjacent to, illuminated pixels of the self-emissive display. To this end, the pixels of the self-emissive display and the pixels of the masking display are aligned with each other. Conversely, the controller may also increase absorption in regions of the masking display, which correspond to less brighter pixels of the self-emissive display in order to increase a contrast of the self-emissive display. In other words, a readability of the transparent display may be enhanced by masking a distracting bright background through the transparent substrate.

According to one embodiment, the controller is used to increase an overall absorption of the masking display or an absorption in regions of an outer light source, which is detected by the light sensor of the transparent display. For this functionality, the respective pixels do not need to be aligned. In particular, the controller can be operative to increase absorption in regions of the masking display, which correspond to a direction of an exterior light source.

In a further embodiment, the controller is operative to synchronize an absorption time interval of the masking display to an illumination time interval of the self-emissive display.

In one embodiment, the time intervals are determined by counting a pre-determined number of signals of a timer, such as an electrically driven crystal oscillator, which is provided on the controller.

In a further embodiment, the size of the pixels of the masking display corresponds to the size of the pixels of the self-emissive display. In particular, the size can be a multiple of the size of the pixels of the self-emissive display.

According to one embodiment, the display controller is operative to use the signals of one or more light sensors of the transparent display to detect an overall exterior light intensity and to adjust an absorption of the masking display and an intensity of the self-emissive display accordingly.

In a further embodiment, the transparent display comprises an input connection for receiving data from a vehicle camera.

According to this embodiment, the display controller is operative to determine an exterior light condition depending on the signal of the light sensor and depending on an input signal from the vehicle camera. To this end, the display controller evaluates the raw image frames or pre-processed information, such as coordinates and direction of a light source.

In particular, the display controller uses the input signals from the light sensor and/or from the vehicle camera to detect and to track a direction of an exterior light source and to control the masking display accordingly by selectively increasing the absorption of regions of the masking display that correspond to the detected location of the exterior light source.

According to another embodiment, the masking display comprises an electronically controllable polarization filter, wherein the controller is operative to control the polarization filter of the masking display in dependence of control signals that are sent from the display controller to the self-emissive display, wherein the control signals determine an illumination of the self-emissive display.

Furthermore, the present specification discloses a vehicle with the aforementioned transparent display. In one embodiment, the transparent display is attached to a window of the vehicle and a power input of the display controller is connected to a power supply of the vehicle. In another embodiment, the transparent display is used as a stand-alone display, for example as a display that can be clipped onto a support on the dashboard. The display controller can also be connected to an automotive data bus and/or to a vehicle camera.

According to a further aspect, the present specification discloses a controller for adjusting an absorption of pixels of a masking display and a brightness of pixels of a self-emissive display.

The controller comprises a first output connection for connecting the self-emissive display and a second output connection for connecting the masking display. Furthermore, a sensor input connection is provided for receiving a signal of a light sensor. The signal of the light sensor also refers to a processed signal, which is derived from the raw signal of the light sensor, such as a digitized signal or to a signal, which is processed by a further electronic component. For example, the further electronic component may determine a direction from which a light beam of a car's spotlight came from and a solid angle of the light source.

Furthermore, the controller comprises a data input for receiving data that is to be displayed on the self-emissive display. For example, the data input may be connected to a cable to an electronic instrument cluster such that alert symbols and other information, which is displayed on the instrument cluster, can also be displayed on a car's windscreen. Thereby, a driver does not have to turn his attention away from observing the road in front of the car.

The controller is operative to generate a first control signal for selectively controlling the intensity of display pixels of the self-emissive display and to generate a second control signal for selectively controlling the absorption of display pixels of the masking display, wherein the absorption depends on the signal of the light sensor.

Furthermore, the control signals that are sent to one display may also depend on the control signals that are sent to the respective other display. Moreover, the control signals to the self-emissive display may also depend on the signal received from the light sensor.

In a further aspect, the present specification discloses a computer implemented method for adjusting a transparent display. More specifically, control signals to the transparent display are adjusted. The transparent display comprises a self-emissive display and a masking display, which is provided back-to-back to the transparent display. Furthermore, the masking display corresponds in size to the self-emissive display and is aligned to the self-emissive display.

The sizes can be adjusted such that an area of the masking display is essentially the same as an area of the self-emissive display. In particular embodiments, a difference of the display areas may be at most 2%, at most 5%, or at most 10% with respect to an area size of one of the displays.

Furthermore, the resolution or the pixel pitch of the two displays may be matched to each other. According to particular embodiments, the pixel pitch of one display is a multiple of the pixel of the other display or is with 2%, 5%, or 10% of the multiple. According to further embodiments, a resolution of the two displays differs by at most 2%, at most 5%, or at most 10% with respect to one of the resolutions.

A sensor signal is received from a light sensor of the transparent display. A control signal is sent to a self-emissive display for displaying data on the self-emissive display. Furthermore, an absorption of pixels of a masking display in dependence of the sensor signal of the light sensor.

Furthermore, the method may also comprise receiving further input and/or adjusting the control signals to the respective displays in the various ways described above.

Moreover, the present specification discloses a computer program product with a computer readable memory that comprises computer executable or computer readable instructions for executing the aforementioned method.

A transparent display according to the current specification can improve a viewing experience from a primary viewing side and reduce unintended light effects when viewed from the non-primary side.

The transparent display provides a bi-directional passage of light in order to realize the transparency. The transparent display is controlled such that the below mentioned effects, which can have a negative impact on the viewing quality, are taken into account. Thereby, the viewing experience and the readability of the display can be improved.

When an observer looks onto the display from the backside or secondary side, the displayed contents of the primary side may be visible to the observer on the secondary display side or they may interfere with content displayed on the secondary display side. This effect is strongest in low light, such as evening and/or night conditions.

Furthermore, a light source on the secondary side, such as light from an incoming vehicle or incandescent light, can affect the viewing quality on the primary side.

In particular, the display can be used in a car's windscreen, or as a rear seat window transparent display to implement augmented reality during night conditions or in low light conditions, such providing a display of navigation or dashboard information while looking through the windshield of a car or window.

Furthermore, the display may provide night vision features such as an automatic detection of other road users. In one embodiment, a light sensor is provided that monitors the light conditions. The sensor signal can be used to toggle the display automatically depending on the sensed light conditions. Furthermore, the light sensor signal can be used to adapt the intensity of the display surfaces.

A display according to the present specification comprises four major parts:
1. A transparent display that is based on OLED or another self-emissive technology. Herein "self-emissive" stands in contrast to non-emissive display, such as an LCD display;
2. A TFT-LCD as a masking display. In the context of the present application, the TFT-LCD does not have its own background illumination. Rather, it is used as a masking display which masks out external light sources or the illumination of the OLED display;
3. A light sensor for sensing the ambient light conditions and the presence of one or more light sources behind the transparent display; and
4. A display electronics for synchronizing the two displays. The display electronics is provided on a controller, which is connected to each of the two displays.

Among others, the display can, under certain conditions, provide the following improvements:
1. A removal or a reduction of annoying effects of light from the secondary display side;
2. An improved display of a displayed picture when there is a light source on the secondary display side during movement of the car;
3. A sensor based automatic adjustment of TFT elements, depending on the detected presence of a light source on the secondary display side and depending on a detected change of the ambient light conditions;
4. A selection of a privacy mode in which the displayed contents on the primary side cannot be seen on the secondary side. This is achieved by controlling the masking display accordingly. In particular, an absorption of the masking display may be adjusted such that the contents of the self-emissive display are no longer visible from the outside. According to another option, the OLED display emits polarized light, which is blocked by an electrically controllable polarization filter; and
5. In some embodiments, this may lead to a situation in which the display is no longer transparent enough to see the outside scene in front of a windscreen. If desired, this effect can be compensated by overlaying image frames from a vehicle camera with further information and displaying the resulting combined image on the self-emissive display.

BRIEF DESCRIPTION OF THE DRAWINGS

The subject of the present specification is now explained in further detail with respect to the following Figures in which.

DETAILED DESCRIPTION OF THE PRESENTLY PREFERRED EMBODIMENTS

In the following description, details are provided to describe the embodiments of the present specification. It shall be apparent to one skilled in the art, however, that the embodiments may be practised without such details.

Figure 1:
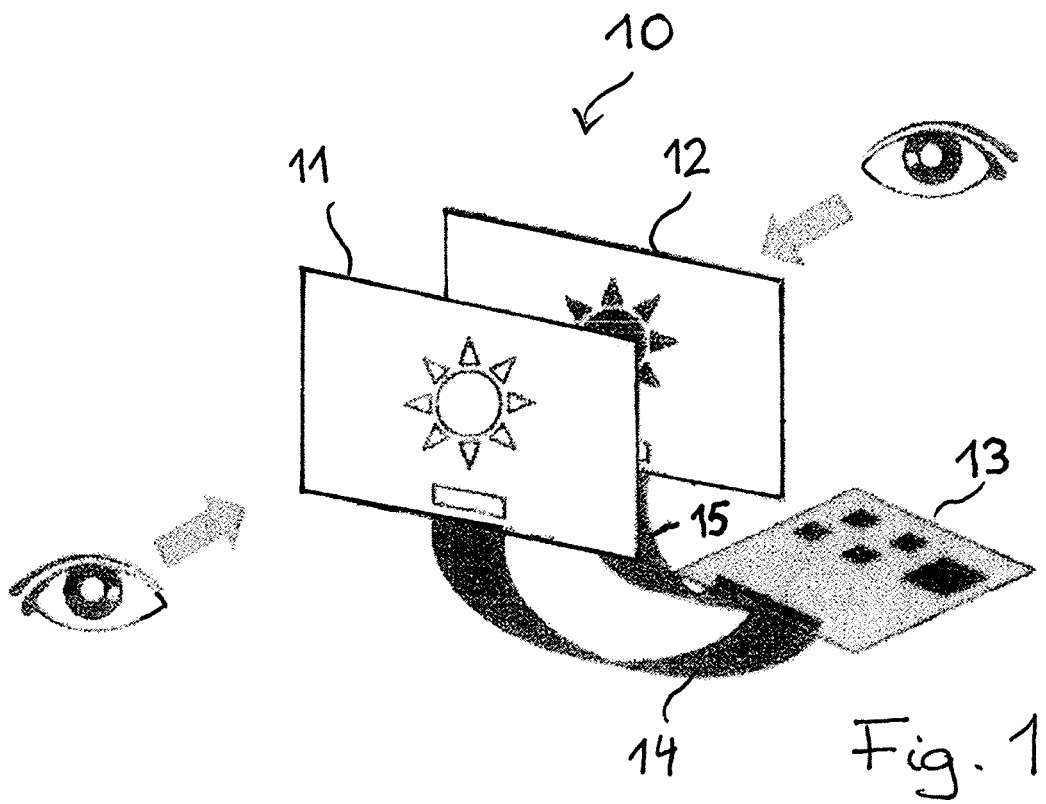
FIG. 1 is an embodiment of a display in a first operation mode.

FIG. 1 shows a display according to the present specification in a first mode.

The display comprises a transparent OLED display and a TFT LCD display, which are arranged side by side. The OLED display and the TFT LCD display are separately connected to a circuit board via a first cable and via second cable. The OLED display is also referred to as "self-emissive display" and the TFT LCD display is also referred to as "masking display".

The circuit board comprises a display driving system for synchronizing the two displays, which includes a microprocessor.

In the first mode, which is also referred to as "privacy mode" light from the OLED display is blocked out such that the displayed information is no longer visible from the secondary side.

According to a first realization, the first mode is achieved by controlling all LCDs of the LCD display such that they permanently absorb the light from the primary side. Thereby, the information of the OLED display cannot be seen on the secondary side. At least the intensity on the secondary side is reduced to such a degree that the information of the OLED display cannot easily be seen.

As the display is permanently dimmed in this realization, the external scenery may be dimmed or invisible from the inside. If desired, this effect can be compensated by using image frames of a vehicle camera, combining the information of the OLED display with the image frames and displaying the combined information on the OLED display.

According to a modified embodiment, the pixels of the OLED display and of the masking display are aligned such that pixels of the masking display can be used to selectively mask out only the illuminated pixels of the OLED display or regions around the illuminated pixels. Even if the pixels of the OLED display and the masking display are not precisely aligned, it is still possible to mask out regions around the illuminated pixels.

Thereby, the exterior light outside the masked regions is still visible from the primary side.

In general, the display is easier to manufacture when the pixels of the OLED display and the masking display are not required to have the same size and/or to have an exact alignment. On the other hand, a matching of the size and/or a pixel alignment can provide additional functionality.

According to a further embodiment, the masking pixels of the LCD display are aligned to the subpixels of the OLED display, which correspond to the primary colors of the OLED display. The subpixels can be provided by equally sized adjacent pixel regions or by unequally sized pixel regions, such as in a Pen-Tile arrangement. By selectively masking the subpixels it is possible to filter out the colors of the OLED display selectively.

According to a further realization, the primary side is illuminated in short intervals and the LCD display is controlled to absorb passing light during the short intervals in which the OLED display is illuminated and to be transparent in the time between the short intervals. Thereby, the information of the OLED display is invisible from the secondary side while the exterior scenery is still visible from the primary side.

According to a further realization, the OLED display comprises an arrangement that is capable of emitting polarized light and the masking display comprises an electrically controllable polarization filter. In the first mode, the polarization filter is controlled to filter out the light from the OLED display. Thereby, the information of the OLED display is invisible from the secondary side while the exterior scenery is still visible from the primary side.

According to a further modification, the OLED display and the polarization filter are controlled to switch the polarization and the corresponding polarization filtering in intervals. Thereby, the light from the OLED display is blocked from the outside while both polarization directions of the exterior light are still visible.

Figure 2:
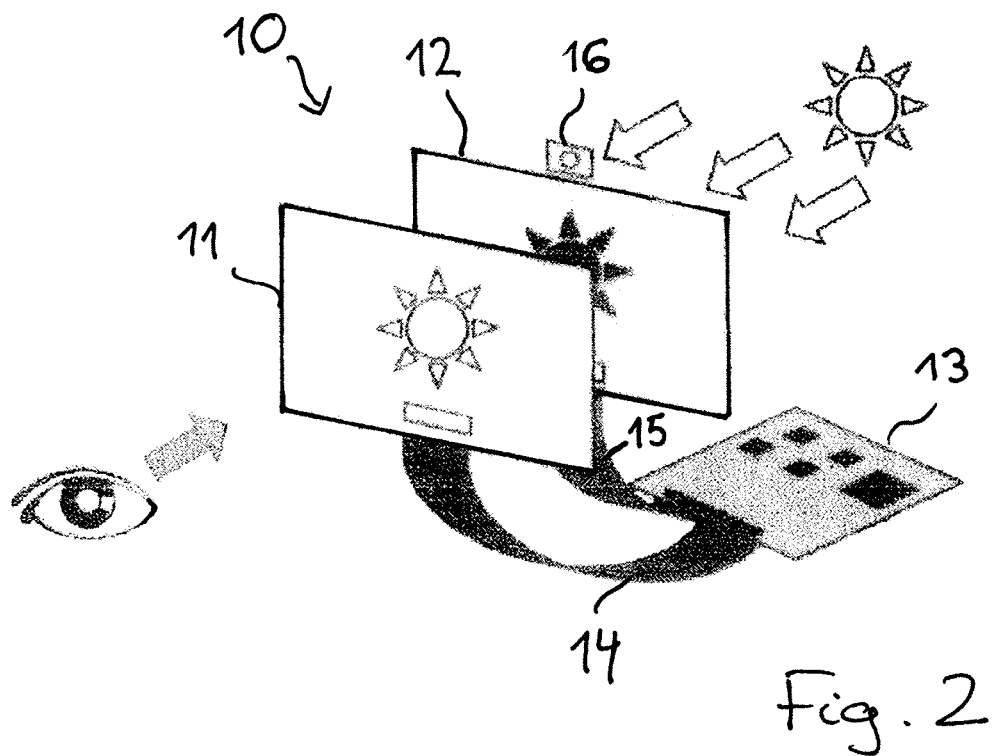
FIG. 2 is the display of FIG. 1 in a second operation mode.

FIG. 2 shows the display of FIG. 1 in a second mode. According to the second mode, there is incident light on the outward side of the TFT LCD display. A light sensor 16, which is not shown in FIG. 1, is provided at the TFT LCD display for detecting the incident light.

During operation, the light sensor 16 measures the intensity of the ambient light. Depending on the ambient light conditions, the absorption of the masking display and the intensity of the OLED display is varied. For example, during fall season an evening sun glare may affect the vision negatively. In this case, the absorption of the LCD display is increased to filter out the sun radiation. In another case, an incident radiation of an oncoming car may dazzle the driver, especially when the oncoming car did not switch out the high beam.

The LCD display can be controlled to filter out the head light of the oncoming car.

On the other hand, the absorption of the masking display can be reduced to a minimum when the exterior light is very dim.

Furthermore, the intensity of the OLED display can be varied according to the exterior light conditions. For example, during daylight the OLED display can be controlled to a higher intensity to ensure visibility of the OLED display and it can be dimmed down during night time to avoid a glaring effect and to save energy and display lifetime. Furthermore, the LCD display can also be controlled to absorb light when the vehicle is parked in intense sun radiation to prolong the life-time of the OLED display.

According to the present specification, the information of the light sensor can also be combined with information that is available form a vehicle camera. Thereby, an illumination configuration can be detected more accurately and the adaptation of the masking display and the primary display can be varied according to the detected illumination configuration. For example, the masking display can be controlled to mask out only certain areas of the masking display, which correspond to the detected light source. In particular, the additional information from the vehicle camera can be used to localize the light source and to track the motion of the light source.

Although the above description contains much specificity, these should not be construed as limiting the scope of the embodiments but merely providing illustration of the foreseeable embodiments. Especially the above stated advantages of the embodiments should not be construed as limiting the scope of the embodiments but merely to explain possible achievements if the described embodiments are put into practise. Thus, the scope of the embodiments should be determined by the claims and their equivalents, rather than by the examples given.

The embodiments can also be described with the following lists of elements being organized into items. The respective combinations of features which are disclosed in the item list are regarded as independent subject matter, respectively, that can also be combined with other features of the application.

1. A transparent display for a vehicle, the transparent display comprising:
    a self-emissive display, the self-emissive display having an electronically adjustable brightness,
    a masking display, the masking display comprising an electronically adjustable absorption, and the masking display being arranged back-to-back with the self-emissive display, and
    at least one light sensor that is arranged in proximity to the masking display,
    a display controller, the display controller being connected to the self-emissive display, to the masking display and to the at least one light sensor,
    the display controller being operative to adapt the absorption of the masking display in response to a signal of the at least one light sensor.
2. The transparent display according to item 1, wherein the self-emissive display comprises an OLED display.
3. The transparent display according to item 1 or item 2, wherein the masking display comprises an LCD display.
4. The transparent display according to item 3, wherein the LCD display is a TFT LCD display.
5. The transparent display according to one of the preceding items, wherein the controller is operative to increase absorption in regions of the masking display, wherein the regions correspond to illuminated pixels of the self-emissive display.
6. The transparent display according to one of the preceding items, wherein the controller is operative to increase absorption in regions of the masking display which correspond to a direction of an exterior light source.
7. The transparent display according to one of the preceding items, wherein pixels of the masking display are aligned with pixels of the self-emissive display.
8. The transparent display according to one of the preceding items, wherein the size of the pixels of the masking display corresponds to the size of the pixels of the self-emissive display.
9. The transparent display according to one of the preceding items, wherein the display controller is operative to detect an overall exterior light intensity and to adjust an absorption of the masking display and an intensity of the self-emissive display accordingly.
10. The transparent display according to one of the preceding items, comprising
    an input connection for receiving data from a vehicle camera, wherein the display controller is operative to determine an exterior light condition depending on the signal of the at least one light sensor and on an input signal from the vehicle camera.

11. The transparent display according to item 10, wherein the display controller is operative to detect and to track a direction of an exterior light source and to control the masking display to selectively increase the absorption of regions of the masking display which correspond to the detected location of the exterior light source.

12. A vehicle with the transparent display according to one of the preceding items, wherein the transparent display is attached to a window of the vehicle and wherein the display controller is connected to a power supply of the vehicle.

13. A controller for adjusting an absorption of a masking display and a brightness of a self-emissive display, the controller comprising
a first output connection for connecting the selfemissive display and
a second output connection for connecting the masking display,
a sensor input connection for receiving a signal of at least one light sensor, and
a data input for receiving data to be displayed on the self-emissive display,
wherein the controller is operative to generate a first control signal for selectively controlling the intensity of display pixels of the self-emissive display and to generate a second control signal for selectively controlling the absorption of display pixels of the masking display, wherein the absorption depends on the signal of the at least one light sensor.

14. Method for adjusting a transparent display, the transparent display comprising a self-emissive display and a masking display, which are arranged back-to-back, the method comprising
receiving a sensor signal of at least one light sensor of the transparent display,
sending a control signal to a self-emissive display for displaying data on the self-emissive display,
adjusting an absorption of a masking display in dependence of the sensor signal.

15. Computer program product for executing the method according to item 14.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A transparent display for a vehicle, comprising
a self-emissive display having an electronically adjustable brightness;
a masking display comprising an electronically adjustable absorption, and being arranged directly adjacent to the self-emissive display;
at least one light sensor arranged in proximity to the masking display; and
a display controller connected to the self-emissive display, to the masking display, and to the at least one light sensor, and configured to adapt the absorption of the masking display in response to a signal of the at least one light sensor,
wherein the display controller is configured to at least one of:
control the masking display generate a privacy mode so that an absorption of the masking display is adjusted such that contents of the self-emissive display are no longer visible from an outside of the vehicle,
control an electrically controllable polarization filter to generate a privacy mode to block light emitted by the self-emissive display, and
control the self-emissive display so that it is illuminated in short intervals and the masking display is controlled to absorb passing light during the short intervals in which the self-emissive display is illuminated and to be transparent in a time between the short intervals, whereby information of the self-emissive display is invisible from outside of the vehicle while the outside of the vehicle is still visible from an inside of the vehicle.

2. The transparent display according to claim 1, wherein the self-emissive display comprises an OLED display.

3. The transparent display according to claim 1, wherein the masking display comprises an LCD display.

4. The transparent display according to claim 3, wherein the LCD display is a TFT LCD display.

5. The transparent display according to claim 1, wherein the controller is configured to increase absorption in regions of the masking display, wherein the regions correspond to illuminated pixels of the self-emissive display.

6. The transparent display according to claim 1, wherein the controller is configured to increase absorption in regions of the masking display that correspond to a direction of an exterior light source.

7. The transparent display according to claim 1, wherein pixels of the masking display are aligned with pixels of the self-emissive display.

8. The transparent display according to claim 1, wherein a size of the pixels of the masking display corresponds to a size of the pixels of the self-emissive display.

9. The transparent display according to claim 1, wherein the display controller is configured to detect an overall exterior light intensity and to adjust an absorption of the masking display and an intensity of the self-emissive display based at least in part on the detected overall exterior light intensity.

10. The transparent display according to claim 1, further comprising
an input connection configured to receive data from a vehicle camera,
wherein the display controller is configured to determine an exterior light condition based at least in part on the signal of the at least one light sensor and on an input signal from the vehicle camera.

11. The transparent display according to claim 10, wherein the display controller is configured to detect and to track a direction of an exterior light source and to control the masking display to selectively increase the absorption of regions of the masking display that correspond to the detected location of the exterior light source.

12. A vehicle comprising:
   a window;
   a power supply; and
   a transparent display, comprising
      a self-emissive display having an electronically adjustable brightness;
      a masking display comprising an electronically adjustable absorption, and being arranged directly adjacent to the self- emissive display;
      at least one light sensor arranged in proximity to the masking display; and
      a display controller connected to the self-emissive display, to the masking display, and to the at least one light sensor, and configured to adapt the absorption of the masking display in response to a signal of the at least one light sensor,
   wherein the transparent display is attached to the window of the vehicle, and
   wherein the display controller is connected to the power supply of the vehicle,
   wherein the display controller is configured to at least one of:
      control the masking display to generate a privacy mode so that an absorption of the masking display is adjusted such that contents of the self-emissive display are no longer visible from an outside of the vehicle,
      control an electrically controllable polarization filter to generate a privacy mode to block light emitted by the self-emissive display, and
      control the self-emissive display so that it is illuminated in short intervals and the masking display is controlled to absorb passing light during the short intervals in which the self-emissive display is illuminated and to be transparent in a time between the short intervals, whereby information of the self-emissive display is invisible from outside of the vehicle while the outside of the vehicle is still visible from an inside of the vehicle.

13. A controller for adjusting an absorption of a masking display and a brightness of a self-emissive display, comprising:
   a first output connection configured to connect the self-emissive display;
   a second output connection configured to connect the masking display;
   a sensor input connection configured to receive a signal of at least one light sensor;
   a data input configured to receive data to be displayed on the self-emissive display; and
   wherein the controller is configured to generate a first control signal for selectively controlling the intensity of display pixels of the self-emissive display and to generate a second control signal for selectively controlling the absorption of display pixels of the masking display,
   wherein the display controller is further configured to at least one of:
      control the masking display to generate a privacy mode so that an absorption of the masking display is adjusted such that contents of the self-emissive display are no longer visible from an outside of the vehicle,
      control an electrically controllable polarization filter to generate a privacy mode to block light emitted by the self-emissive display, and
      control the self-emissive display so that it is illuminated in short intervals and the masking display is controlled to absorb passing light during the short intervals in which the self-emissive display is illuminated and to be transparent in a time between the short intervals, whereby information of the self-emissive display is invisible from outside of the vehicle while the outside of the vehicle is still visible from an inside of the vehicle, and
   wherein the absorption depends on the signal of the at least one light sensor.

14. A method for adjusting a transparent display, the transparent display including a self-emissive display and a masking display, which are arranged directly back-to-back, the method comprising:
   receiving a sensor signal of at least one light sensor of the transparent display;
   sending a control signal to a self-emissive display for displaying data on the self-emissive display for selectively controlling the absorption of display pixels of the masking display;
   adjusting an absorption of a masking display based at least in part on the sensor signal, and
   at least one of:
   control the masking display to generate a privacy mode so that an absorption of the masking display is adjusted such that the data of the self-emissive display is no longer visible from an outside of the vehicle,
   control an electrically controllable polarization filter to generate a privacy mode to block light emitted by the self-emissive display, and
   control the self-emissive display so that it is illuminated in short intervals and the masking display is controlled to absorb passing light during the short intervals in which the self-emissive display is illuminated and to be transparent in a time between the short intervals, whereby information of the self-emissive display is invisible from outside of the vehicle while the outside of the vehicle is still visible from an inside of the vehicle, and
   wherein pixels of the self-emissive display and of the masking display are aligned such that pixels of the masking display are configured to selectively mask out at least one of only illuminated pixels of the self-emissive display and regions around the illuminated pixels.

15. A computer program product stored on a nontransient computer readable medium, for adjusting a transparent display, the transparent display including a self-emissive display and a masking display, which are arranged back-to-back, the computer program product, when executed by a processor causes the processor to:
   receive a sensor signal of at least one light sensor of the transparent display;
   send a control signal to a self-emissive display for displaying data on the self-emissive display for selectively controlling the absorption of display pixels of the masking display; and
   adjust an absorption of a masking display based at least in part on the sensor signal, and
   at least one of:
   control the masking display to generate a privacy mode so that an absorption of the masking display is adjusted such that the data of the self-emissive display is no longer visible from an outside of the vehicle, control an electrically controllable polarization filter to generate a privacy mode to block light emitted by the self-emissive display, and control the self-emissive display so that it is illuminated in short intervals and the masking display is controlled to absorb passing light during the short intervals in which the self-emissive display is illuminated and to be transparent in a time between the short intervals, whereby information of the self-emissive display is invisible from outside of the vehicle while the outside of the vehicle is still visible from an inside of the vehicle, and wherein pixels of the self-emissive display and of the masking display are aligned such that pixels of the masking display are configured to selectively mask out at least one of only illuminated pixels of the self-emissive display and regions around the illuminated pixels.

16. The transparent display according to claim 1, wherein pixels of the self-emissive display and of the masking display are aligned such that pixels of the masking display are configured to selectively mask out at least one of only illuminated pixels of the self-emissive display and regions around the illuminated pixels.

\* \* \* \* \*